United States Patent
Miyajima

(10) Patent No.: US 12,184,114 B2
(45) Date of Patent: Dec. 31, 2024

(54) BATTERY SYSTEM

(71) Applicant: TOYOTA JIDOSHA KABUSHIKI KAISHA, Toyota (JP)

(72) Inventor: Takayuki Miyajima, Nagoya (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 540 days.

(21) Appl. No.: 17/560,843

(22) Filed: Dec. 23, 2021

(65) Prior Publication Data

US 2022/0216720 A1    Jul. 7, 2022

(30) Foreign Application Priority Data

Jan. 7, 2021    (JP) ................ 2021-001440

(51) Int. Cl.
| | |
|---|---|
| *H02J 7/00* | (2006.01) |
| *G01R 31/3835* | (2019.01) |
| *H01M 10/052* | (2010.01) |
| *H01M 10/0525* | (2010.01) |
| *H01M 10/0562* | (2010.01) |
| *H01M 10/0585* | (2010.01) |
| *H01M 10/44* | (2006.01) |
| *H01M 10/48* | (2006.01) |
| *H01M 10/42* | (2006.01) |

(52) U.S. Cl.
CPC .... *H02J 7/007182* (2020.01); *G01R 31/3835* (2019.01); *H01M 10/052* (2013.01); *H01M 10/0525* (2013.01); *H01M 10/0562* (2013.01); *H01M 10/0585* (2013.01); *H01M 10/44* (2013.01); *H01M 10/48* (2013.01); *H01M 2010/4271* (2013.01); *H01M 2300/0065* (2013.01)

(58) Field of Classification Search
CPC .......... H02J 7/007182; H01M 10/052; H01M 10/0525; H01M 10/0562; H01M 10/0585; H01M 10/44; H01M 10/48; H01M 2010/4271; H01M 2300/0065; G01R 31/3835
USPC ....................................................... 320/162
See application file for complete search history.

(56) References Cited

U.S. PATENT DOCUMENTS

| | | | |
|---|---|---|---|
| 2017/0052228 A1* | 2/2017 | Hariharan | .......... G01R 31/3842 |
| 2020/0217901 A1* | 7/2020 | Sugiyama | .......... H02J 7/00036 |

FOREIGN PATENT DOCUMENTS

JP         2018085789 A        5/2018

* cited by examiner

*Primary Examiner* — Zixuan Zhou
(74) *Attorney, Agent, or Firm* — Dickinson Wright, PLLC

(57) ABSTRACT

A battery system comprising a controller and a solid-state lithium secondary battery, wherein, the controller estimates an end part cathode potential Ve2 from a voltage relaxation amount $\Delta V_2$; the end part cathode potential Ve2 is a local potential of an end part of the cathode; and the voltage relaxation amount $\Delta V_2$ is generated by diffusion of, into the non-facing part of the anode, lithium transferred to the facing part of the anode from the cathode of the solid-state lithium secondary battery is a charged state, and wherein the controller controls execution and inexecution of charging of the solid-state lithium secondary battery so that the end part cathode potential Ve2 is equal to or less than a potential Vlimit at which a change in crystal structure of the cathode active material occurs.

3 Claims, 4 Drawing Sheets

BATTERY SYSTEM

TECHNICAL FIELD

The disclosure relates to a battery system.

BACKGROUND

Recently, with the rapid spread of information-related devices and communication devices such as personal computers, video cameras and mobile phones, the development of batteries for use as the power source of the devices, is increasingly important. Also, in the automotive industry, etc., the development of high-power and high-capacity batteries for battery electric vehicles or hybrid electric vehicles is underway.

Also, a solid-state battery has attracted attention for the following reason: as the electrolyte interposed between the cathode and the anode, a solid electrolyte is used instead of an electrolytic solution containing an organic solvent.

Patent Literature 1 discloses a technique for preventing battery deterioration by estimating a positive electrode potential in a secondary battery system including a lithium ion secondary battery, which is a deterioration caused by the fixation of lithium metal starting to be deposited in the anode.

Patent Literature 1: Japanese Patent Application Laid-Open (JP-A) No. 2018-085789

The technique described in Patent Literature 1 can suppress lithium deposition in the anode. However, it cannot suppress such a phenomenon, that battery performance is decreased by a change in the crystal structure of the cathode active material due to an increase in the potential of the cathode itself.

In a solid-state lithium secondary battery, the electrode body cannot have a wound structure, and the structure of the electrode body, is a laminated structure. Accordingly, a non-cathode facing part is likely to be formed in the anode. Once the non-cathode facing part is formed in the anode, the potential of the cathode end part is likely to be high.

SUMMARY

The disclosed embodiments were achieved in light of the above circumstances. An object of the disclosed embodiments is to provide a battery system configured to suppress a decrease in battery performance which is caused by a change in the crystal structure of the cathode active material due to Li deposition.

In a first embodiment, there is provided a battery system comprising a controller and a solid-state lithium secondary battery comprising a cathode, an anode and a solid electrolyte layer disposed between the cathode and the anode,
wherein the cathode comprises a cathode layer;
wherein the cathode layer comprises a cathode active material;
wherein the anode comprises a facing part and a non-facing part; the facing part is a region facing the cathode; and the non-facing part is a region non-facing the cathode;
wherein the controller estimates an end part cathode potential Ve2 from a voltage relaxation amount $\Delta V_2$; the end part cathode potential Ve2 is a local potential of an end part of the cathode; and the voltage relaxation amount $\Delta V_2$ is generated by diffusion of, into the non-facing part of the anode, lithium transferred to the facing part of the anode from the cathode of the solid-state lithium secondary battery in a charged state; and
wherein the controller controls execution and inexecution of charging of the solid-state lithium secondary battery so that the end part cathode potential Ve2 is equal to or less than a potential Vlimit at which a change in crystal structure of the cathode active material occurs.

The batter system of the disclosed embodiments may be the battery system,
wherein the controller detects a voltage V1 of the solid-state lithium secondary battery and calculates an end part cathode potential Ve1 from the voltage V1, which is a local potential of the end part of the cathode;
wherein the controller determines whether or not the voltage V1 is a voltage at which the end part cathode potential Ve1 is equal to or less than the potential Vlimit;
wherein, when the voltage V1 is determined to be the voltage at which the end part cathode potential Ve1 is equal to or less than the potential Vlimit, the controller sets the voltage at which the end part cathode potential Ve1 is equal to the potential Vlimit, to a first charging inhibition voltage, and the controller executes first charging by which the solid-state lithium secondary battery is charged until the first charging inhibition voltage is reached;
wherein, after the first charging, the controller suspends charging and discharging of the solid-state lithium secondary battery for a certain period of time;
wherein the controller measures the voltage relaxation amount $\Delta V_2$, estimates the end part cathode potential Ve2 from the voltage relaxation amount $\Delta V_2$, and corrects the end part cathode potential Ve1 to the end part cathode potential Ve2;
wherein the controller detects a voltage V2 of the solid-state lithium secondary battery and determines whether or not the voltage V2 is a voltage at which the end part cathode potential Ve2 is equal to or less than the potential Vlimit; and
wherein, when the voltage V2 is determined to be the voltage at which the end part cathode potential Ve2 is equal to or less than the potential Vlimit, the controller sets the voltage at which the end part cathode potential Ve2 is equal to the potential Vlimit, to a second charging inhibition voltage, and the controller executes second charging by which the solid-state lithium secondary battery is charged until the second charging inhibition voltage is reached.

The battery system of the disclosed embodiments may be the battery system,
wherein the controller discharges the solid-state lithium secondary battery after the second charging;
wherein the controller detects a voltage V3 of the solid-state lithium secondary battery;
wherein the controller determines whether or not the voltage V3 is a voltage at which the end part cathode potential Ve2 is less than the potential Vlimit; and
wherein, when the voltage V3 is determined to be the voltage at which the end part cathode potential Ve2 is less than the potential Vlimit, the controller resets settings of the first and second charging inhibition voltages.

According to the disclosed embodiments, a battery system configured to suppress a decrease in battery performance which is caused by a change in the crystal structure of the cathode active material, is provided.

BRIEF DESCRIPTION OF THE DRAWINGS

In the accompanying drawings.

DETAILED DESCRIPTION

Figure 1:
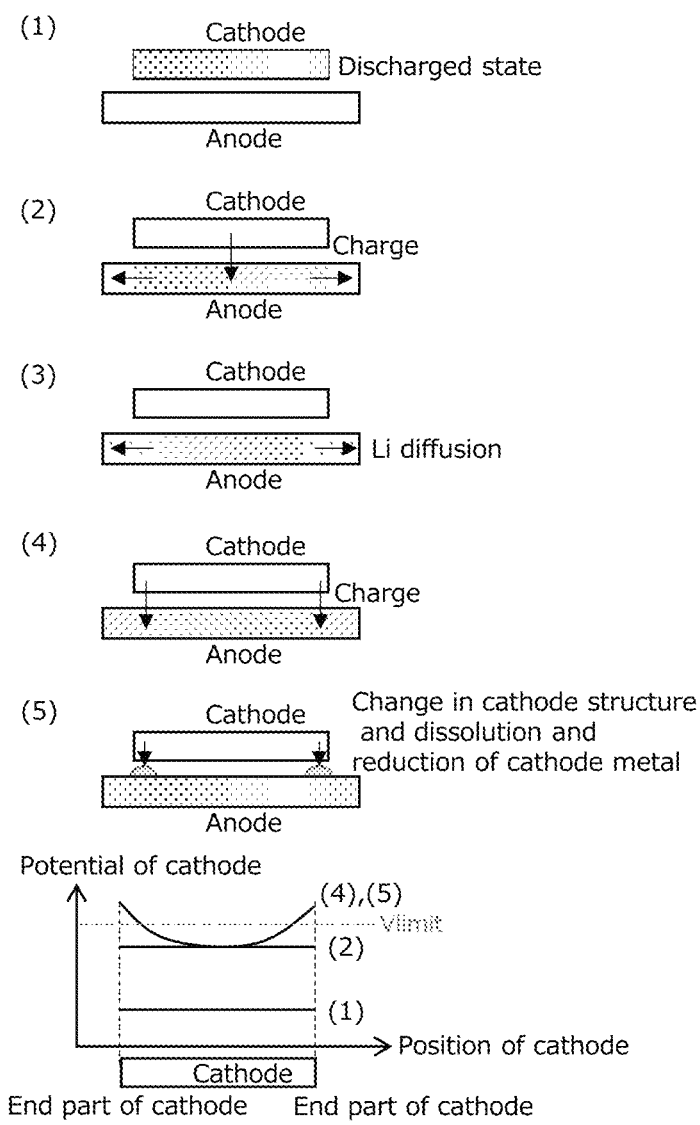
FIG. 1 is a view illustrating the mechanism of generation of a change in the structure of the cathode and illustrating the cathode potential with respect to the cathode position.

The battery system of the disclosed embodiments is a battery system comprising a controller and a solid-state lithium secondary battery comprising a cathode, an anode and a solid electrolyte layer disposed between the cathode and the anode, wherein the cathode comprises a cathode layer;
wherein the cathode layer comprises a cathode active material;
wherein the anode comprises a facing part and a non-facing part; the facing part is a region facing the cathode; and the non-facing part is a region non-facing the cathode;
wherein the controller estimates an end part cathode potential Ve2 from a voltage relaxation amount $\Delta V_2$; the end part cathode potential Ve2 is a local potential of an end part of the cathode; and the voltage relaxation amount $\Delta V_2$ is generated by diffusion of, into the non-facing part of the anode, lithium transferred to the facing part of the anode from the cathode of the solid-state lithium secondary battery in a charged state; and
wherein the controller controls execution and inexecution of charging of the solid-state lithium secondary battery so that the end part cathode potential Ve2 is equal to or less than a potential Vlimit at which a change in crystal structure of the cathode active material occurs.

In the disclosed embodiments, for simplicity, "solid-state lithium secondary battery" may be simply referred to as "battery", "cell" or the like.

Also in the disclosed embodiments, "lithium secondary battery" means a battery in which at least one selected from the group consisting of a lithium metal, a lithium alloy and a lithium compound, is used as the anode active material, and in which a lithium metal deposition-dissolution reaction is used as the anode reaction. Also in the disclosed embodiments, "anode" means an electrode including an anode layer.

In the disclosed embodiments, the state of charge (SOC) value means the percentage of the charge capacity with respect to the full charge capacity of the battery. The full charge capacity is a SOC of 100%. For example, the SOC may be estimated from the open circuit voltage (OCV) of the solid-state battery.

An example of the anode active material is lithium titanate (LTO). It is an electrode material that is resistant to expansion and contraction caused by charge and discharge, compared to Si, carbon and so on. In a solid-state battery, compared to an electrolyte battery including electrolyte-impregnated electrodes, the retention of bonding between the electrodes influences deterioration in battery performance. Accordingly, battery deterioration can be more easily suppressed by using a low-expansion anode active material such as lithium titanate. Meanwhile, lithium titanate has an anode potential of 1.5 V in a normal use range. Accordingly, the potential of the cathode facing the anode is likely to be high, and a change in the crystal structure of the cathode active material is likely to occur.

According to the disclosed embodiments, by calculating the voltage relaxation amount $\Delta V_2$ and by setting a charging inhibition voltage from the end part cathode potential Ve2 on the basis of the voltage relaxation amount $\Delta V_2$ (the second charging inhibition voltage), charging of the battery can be precisely controlled so as to reach a potential that is equal to or less than the potential at which a change in the crystal structure of the cathode active material occurs, and a decrease in solid-state battery performance which is caused by a change in the crystal structure of the cathode active material due to Li deposition, can be suppressed.

According to the disclosed embodiments, by calculating the voltage relaxation amount $\Delta V_2$ and, as needed, by correcting the first charging inhibition voltage, which is set from the initially-set end part cathode potential Ve1, to the second charging inhibition voltage, which is set from the end part cathode potential Ve2 on the basis of the voltage relaxation amount $\Delta V_2$, charging of the battery can be more precisely controlled so as to reach a potential that is equal to or less than the potential at which a change in the crystal structure of the cathode active material occurs.

FIG. 1 is a view illustrating the mechanism of generation of a change in the structure of the cathode and illustrating the cathode potential with respect to the cathode position.

In FIG. 1, (1) the anode and cathode of the solid-state lithium secondary battery being in a discharged state, are shown; (2) once the solid-state lithium secondary battery is charged, lithium transfers from the cathode to the cathode facing part of the anode; (3) lithium diffuses into the non-cathode facing part of the anode; and (4) if the solid-state lithium secondary battery continues to be charged, (5) the structure of the cathode is changed, and the dissolution, reduction and so on of the cathode metal occur. In (4) and (5), the cathode potential of the cathode end part reaches the cathode structure change threshold Vlimit or more.

Figure 2:
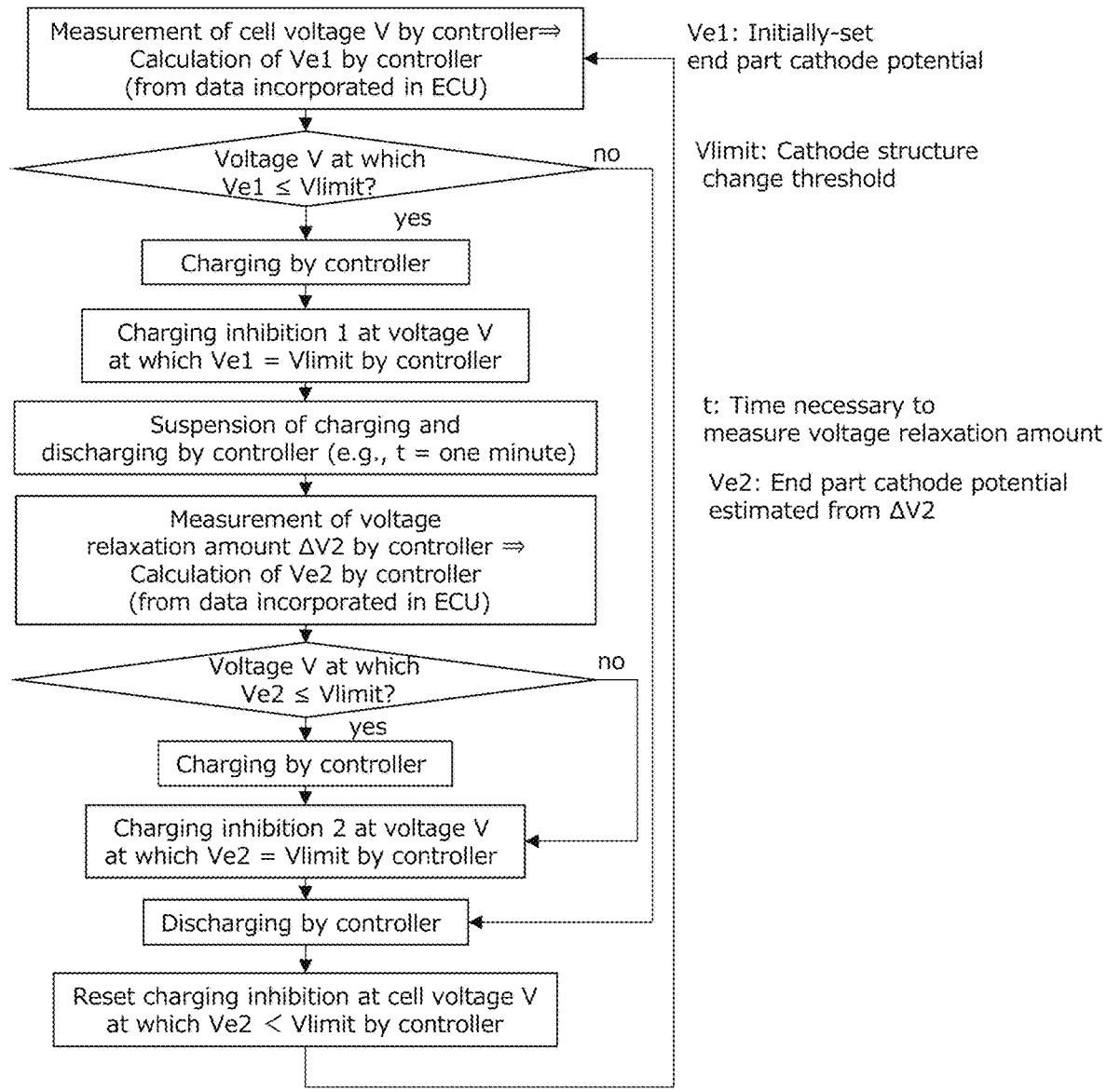
FIG. 2 is a flowchart of an example of the control executed by the battery system of the disclosed embodiments.

FIG. 2 is a flowchart of an example of the control executed by the battery system of the disclosed embodiments.

First, the cell voltage V1 is measured from data incorporated in the ECU, and the initially-set end part cathode potential Ve1 value is calculated.

Next, it is determined whether or not the measured cell voltage V1 is a voltage at which Ve1 is equal to or less than Vlimit (Ve1≤Vlimit). Vlimit is the threshold of the potential at which the cathode structure is changed. For example, the threshold of the potential at which the cathode structure is changed, may be the oxidation-reduction potential of a metal. The oxidation-reduction potential of Co is about 4.2 V, and the oxidation-reduction potential of Ni is about 4.3 V. If charging of the battery is controlled by the plane average potential of the cathode, there is a possibility that a potential equal to or more than Vlimit is reached, and a change in the cathode structure occurs.

When Ve1 is more than Vlimit, discharging of the battery is started. On the other hand, when Ve1 is equal to or less than Vlimit, the voltage at which Ve1 reaches Vlimit is set as the first charging inhibition voltage; charging of the battery is started; and charging of the battery is inhibited (stopped) when the voltage at which Ve1 is equal to Vlimit (Ve1=Vlimit) (the first charging inhibition voltage) is reached (charging inhibition 1).

After the charging inhibition 1, charging and discharging of the battery is suspended for a certain period of time (e.g., t=one minute (where t is the time necessary to measure the voltage relaxation amount)) for measurement of the voltage relaxation amount $\Delta V_2$.

After the suspension of charging and discharging, the voltage relaxation amount $\Delta V_2$ is measured from the data incorporated in the ECU, and Ve2 (the end part cathode potential estimated from $\Delta V_2$) is calculated.

The cell voltage V2 is measured, and it is determined whether or not the measured cell voltage V2 is a voltage at which Ve2 is equal to or less than Vlimit (Ve2≤Vlimit).

When the measured cell voltage V2 is a voltage at which Ve2 is more than Vlimit, discharging of the battery is started. On the other hand, when the measured cell voltage V2 is a voltage at which Ve2 is equal to or less than Vlimit, the voltage at which Ve2 reaches Vlimit is set as the second charging inhibition voltage; charging of the battery is started; and charging of the battery is inhibited (stopped) when the voltage at which Ve2 is equal to Vlimit (Ve2=Vlimit) (the second charging inhibition voltage) is reached (charging inhibition 2).

After the charging inhibition 2, discharging of the battery is started; the cell voltage V3 is measured; and after the measured voltage V3 reaches the voltage at which Ve2 is less than Vlimit (Ve2<Vlimit), the settings of the charging inhibition voltages are reset, and the control is terminated or repeated again from the beginning.

The method for setting the worst assumption line passing through the end part cathode potential Ve1 (the initially-set end part cathode potential value) will be described.

The Ve1 line may be appropriately selected depending on the current passing through the battery and the temperature of the battery.

Figure 3:
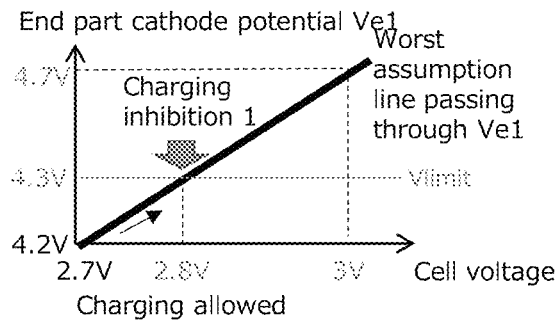
FIG. 3 is a view showing an example of the relationship between the cell voltage and the end part cathode potential Ve1.

FIG. 3 is a view showing an example of the relationship between the cell voltage and the end part cathode potential Ve1.

The voltage use range is set to a range of from 1.5 V to 3 V, and the cathode structure change threshold Vlimit is assumed to be 4.3 V.

Measurement 1: The battery is fully charged until a voltage of 3 V is reached. In the state where the anode end part is thoroughly charged, the end part cathode potential Ve1 is measured. Then, if the end part cathode potential Ve1 is 4.7 V, for example, this case is judged as NG.

Measurement 2: Since a potential of 4.7 V is more than the cathode structure change threshold Vlimit, the cell voltage when the non-cathode facing part of the anode is charged at an extremely low rate in parallel with the facing part and when the end part cathode potential Ve1 reaches 4.3 V or less, is obtained and stored on the ECU as the first charging inhibition voltage (the charging inhibition 1). For example, the voltage is 2.8 V, and the cathode potential is 4.3 V. The first charging inhibition voltage varies depending on the current and temperature of the battery.

The method for setting the line of the voltage relaxation maximum will be described.

Figure 4:
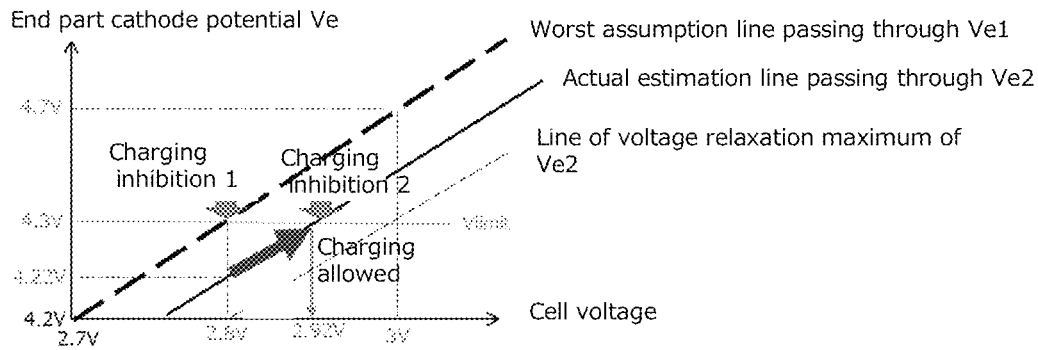
FIG. 4 is a view showing an example of the relationship between the cell voltage and the end part cathode potential Ve.

FIG. 4 is a view showing an example of the relationship between the cell voltage and the end part cathode potential Ve.

Measurement 3: The cell voltage when the non-cathode-facing part of the anode is charged at a high rate in the state where no lithium is present in the non-cathode-facing part of the anode and when the end part cathode potential reaches 4.3 V or less, is obtained and stored on the ECU as the second charging inhibition voltage (the charging inhibition 2). For example, the voltage and the cathode potential may be 2.8 V and 4.3 V, respectively, or the voltage and the cathode potential may be 2.95 V and 4.3 V, respectively. The second charging inhibition voltage varies depending on the current and temperature of the battery.

The method for setting the time t which is necessary to measure the voltage relaxation amount $\Delta V_2$ after the suspension of charging and discharging of the battery, will be described.

Figure 5:
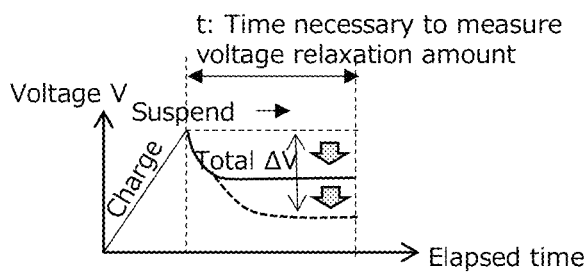
FIG. 5 is a view showing an example of the relationship between the elapsed time and the cell voltage.

FIG. 5 is a view showing an example of the relationship between the elapsed time and the cell voltage.

In FIG. 5, the time necessary to estimate the total $\Delta V$ is defined as "t".

Also, "t" is not needed to be the time necessary to stabilize the cell voltage.

For example, "t" may be set to one minute (t=one minute), and the total $\Delta V$ which is necessary to stabilize the cell voltage may be calculated from voltages $V^{20s}$, $V^{40s}$ and $V^{60s}$, which are voltages 20 seconds, 40 seconds and 60 seconds after the suspension of charging and discharging of the battery, respectively.

$$\Delta V = \alpha V^{20s} + \beta V^{40s} + \gamma V^{60s} \text{(where } \alpha, \beta \text{ and } \gamma \text{ are constants.)}$$

The method for setting the voltage relaxation amount $\Delta V_2$ will be described.

Figure 6:
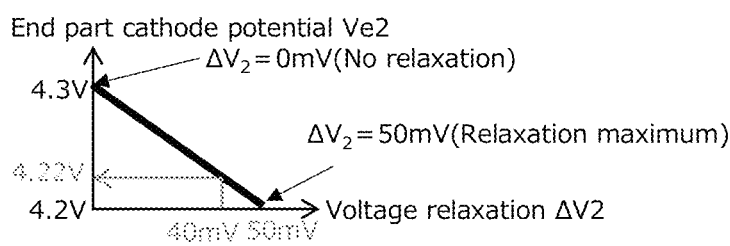
FIG. 6 is a view showing an example of the relationship between the voltage relaxation amount $\Delta V_2$ and the end part cathode potential Ve2.

FIG. 6 is a view showing an example of the relationship between the voltage relaxation amount $\Delta V_2$ and the end part cathode potential Ve2.

Measurement 4: First, $\Delta V_1$ according to current, temperature, time and SOC is obtained and stored on the ECU. Note that $\Delta V_1$ is a voltage return (cathode polarization+anode polarization) due to overvoltage. For example, the maximum $\Delta V_1$ value may be 50 mV.

Measurement 5: The voltage relaxation amount $\Delta V_2$ according to the temperature T and the ratio $\Delta C$ of the area of the facing part of the anode to the area of the non-facing part thereof at the upper limit cell voltage, is obtained and stored on the ECU. For example, the maximum $\Delta V_2$ value may be 50 mV. The voltage relaxation amount $\Delta V_2$ is a voltage return (voltage decrease) due to Li diffusion into the non-cathode facing part of the anode. The rate of voltage relaxation due to lithium diffusion is determined depending on the temperature of the battery and the area of the non-facing part into which lithium can be diffused.

The line of relation between $\Delta V_2$ and Ve2 may be selected depending on the temperature of the battery and the area of the non-facing part into which Li can be diffused.

Figure 7:
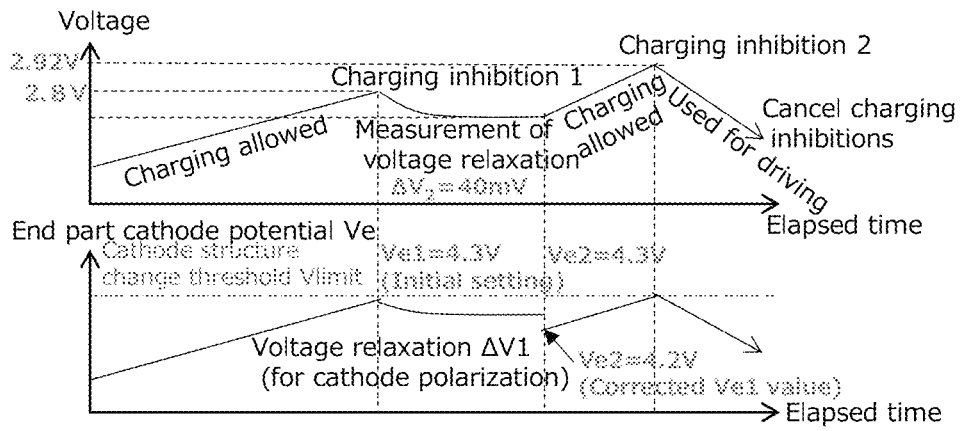
FIG. 7 is a view showing an example of the relationship between the elapsed time of control of the solid-state cell of the disclosed embodiments and the cell voltage, the cell being in the state where the amount of Li in the non-cathode facing part of the anode is small, and an example of the relationship between the elapsed time and the end part cathode potential Ve.

FIG. 7 is a view showing an example of the relationship between the elapsed time of control of the solid-state cell of the disclosed embodiments and the cell voltage, the cell being in the state where the amount of Li in the non-cathode facing part of the anode is small, and an example of the relationship between the elapsed time and the end part cathode potential Ve.

First, charging of the battery is stopped at the first charging inhibition voltage set by the cathode potential of the line of the worst case (the charging inhibition 1).

The voltage relaxation amount $\Delta V_2$ is obtained, and the end part cathode potential Ve1 is corrected to the end part cathode potential Ve2 until an actual estimation line is reached.

Using the actual estimation line, the cell voltage (the second charging inhibition voltage) at which charging is allowed within a range in which the end part cathode potential Ve2 is not more than Vlimit (4.3 V), which is a voltage of 2.92 V, is calculated, and voltage is impressed.

When the cell voltage reaches the second charging inhibition voltage (2.92 V), charging of the battery is stopped (the charging inhibition 2).

When discharging of the battery is started, the settings of the charging inhibition voltage are reset.

Figure 8:
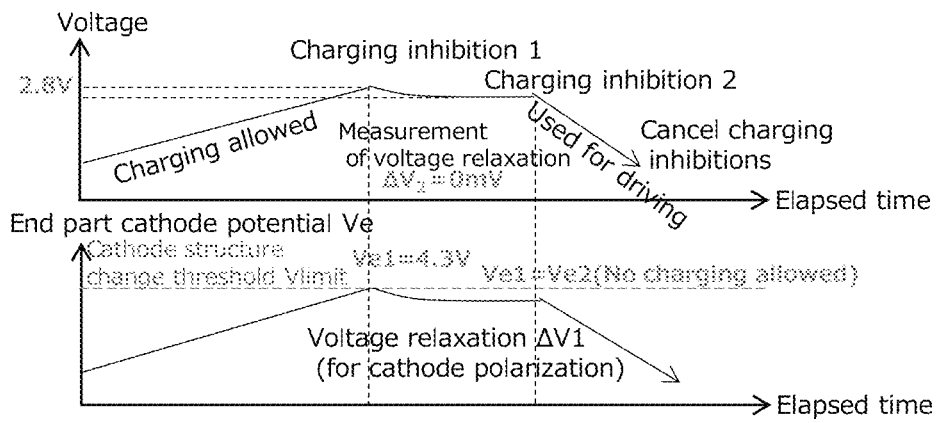
FIG. 8 is a view showing an example of the relationship between the elapsed time of control of the solid-state cell of the disclosed embodiments and the cell voltage, the cell being in the state where Li is present in the non-cathode facing part of the anode, and an example of the relationship between the elapsed time and the end part cathode potential Ve.

FIG. 8 is a view showing an example of the relationship between the elapsed time of control of the solid-state cell of the disclosed embodiments and the cell voltage, the cell being in the state where Li is present in the non-cathode facing part of the anode, and an example of the relationship between the elapsed time and the end part cathode potential Ve.

In this case, the voltage relaxation amount $\Delta V_2$ is 0 mV. Also, the end part cathode potential Ve is not more than Vlimit (4.3 V).

Figure 9:
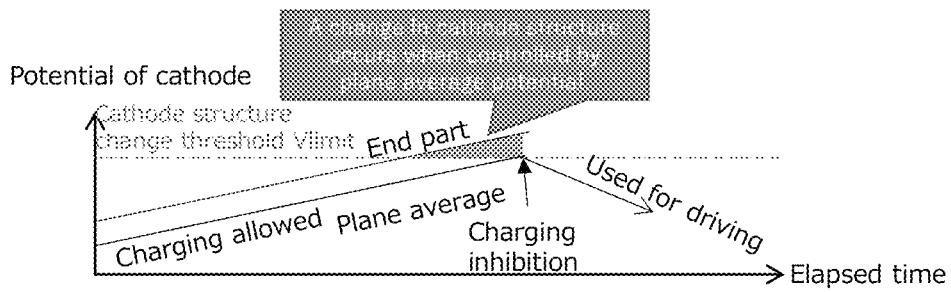
FIG. 9 is a view showing an example of the relationship between the elapsed time of control a conventional battery system and the cathode potential.

FIG. 9 is a view showing an example of the relationship between the elapsed time of control a conventional battery system and the cathode potential.

A conventional battery system is controlled by the plane average potential of the cathode. Accordingly, here is a possibility that the cathode potential is equal to or more than the cathode structure change threshold Vlimit, and a change in the cathode structure occurs.

The battery system of the disclosed embodiments includes the solid-state lithium secondary battery and the controller.

The controller may be an electronic control unit (ECU) or the like.

The ECU includes a central processing unit (CPU), a memory and an input-output buffer. Based on signals received from sensors and on maps and programs stored on the memory, the ECU controls charging and discharging of the solid-state lithium secondary battery.

The controller may include a voltage detector. The voltage detector may be a conventionally-known voltage sensor, a voltmeter or the like.

The controller estimates the end part cathode potential Ve2 from the voltage relaxation amount $\Delta V_2$. The end part cathode potential Ve2 is the local potential of the end part of the cathode, and the voltage relaxation amount $\Delta V_2$ is generated by the diffusion of, into the non-facing part of the anode, lithium transferred to the facing part of the anode from the cathode of the solid-state lithium secondary battery in a charged state.

The controller controls the execution and inexecution or charging of the solid-state lithium secondary battery so that the end part cathode potential Ve2 is equal to or less than the potential Vlimit at which a change in the crystal structure of the cathode active material occurs.

[First Charging]

The controller may detect (measure) the voltage V1 of the solid-state lithium secondary battery and may calculate the end part cathode potential Ve1 from the voltage V1, which is the local potential of the end part of the cathode. The controller may determine whether or not the voltage V1 is the voltage at which the end part cathode potential Ve1 is equal to or less than the potential Vlimit. When the voltage V1 is determined to be the voltage at which the end part cathode potential Ve1 is equal to or less than the potential Vlimit, the controller may set the voltage at which the end part cathode potential Ve1 is equal to the potential Vlimit, to the first charging inhibition voltage, and the controller may execute the first charging by which the solid-state lithium secondary battery is charged until the first charging inhibition voltage is reached. On the other hand, when the voltage V1 is determined to be the voltage at which the end part cathode potential Ve1 is more than the potential Vlimit, the controller may execute discharging of the solid-state lithium secondary battery.

[Suspension of Charging and Discharging]

After the first charging, the controller may suspend charging and discharging of the solid-state lithium secondary battery for a certain period of time.

The certain period of time may be appropriately set as the above-described time t which is necessary to measure the voltage relaxation amount $\Delta V_2$.

[Second Charging]

The controller may measure the voltage relaxation amount $\Delta V_2$, may estimate the end part cathode potential Ve2 from the voltage relaxation amount $\Delta V_2$, and may correct the end part cathode potential Ve1 to the end part cathode potential Ve2.

The controller may detect the voltage V2 of the solid-state lithium secondary battery and may determine whether or not the voltage V2 is the voltage at which the end part cathode potential Ve2 is equal to or less than the potential Vlimit. When the voltage V2 is determined to be the voltage at which the end part cathode potential Ve2 is equal to or less than the potential Vlimit, the controller may set the voltage at which the end part cathode potential Ve2 is equal to the potential Vlimit, to the second charging inhibition voltage, and the controller may execute second charging by which the solid-state lithium secondary battery is charged until the second charging inhibition voltage is reached. On the other hand, when the voltage V2 is determined to be the voltage at which the end part cathode potential Ve2 is more than the potential Vlimit, the controller may execute discharging of the solid-state lithium secondary battery.

[Cancellation of the Settings of the Charging Inhibition Voltages]

The controller may discharge the solid-state lithium secondary battery after the second charging.

The controller may detect the voltage V3 of the solid-state lithium secondary battery, and the controller may determine whether or not the voltage V3 is the voltage at which the end part cathode potential Ve2 is less than the potential Vlimit. When the voltage V3 is determined to be the voltage at which the end part cathode potential Ve2 is less than the potential Vlimit, the controller may cancel (reset) the settings of the first and second charging inhibition voltages.

After the settings of the charging inhibition voltages are cancelled, the controller may terminate the control, or it may repeat the control again from the beginning.

The solid-state lithium secondary battery of the disclosed embodiments includes the cathode, the anode and the solid electrolyte layer disposed between the cathode and the anode. That is, the cathode, the solid electrolyte layer and the anode are disposed in this sequence.

[Cathode]

The cathode includes the cathode layer. As needed, it includes a cathode current collector. A cathode terminal may be connected to the cathode. The cathode current collector may be the cathode terminal.

[Cathode Layer]

The cathode layer contains a cathode active material. As optional components, the cathode layer may contain a solid electrolyte, a conductive material, a binder, etc.

As the cathode active material, examples include, but are not limited to, lithium metal (Li), a lithium alloy, $LiCoO_2$, $LiNi_{0.8}Co_{0.15}Al_{0.05}O_2$, $LiNi_xCo_{1-x}O_2$ (0<x<1), $LiNi_{1/3}Co_{1/3}Mn_{1/3}O_2$, $LiMnO_2$, a different element-substituted Li—Mn spinel, lithium titanate, lithium metal phosphate, LiCoN, $Li_2SiO_3$, and $Li_4SiO_4$, a transition metal oxide, $TiS_2$, Si, $SiO_2$, a Si alloy and a lithium storage intermetallic compound. As the different element-substituted Li—Mn spinel, examples include, but are not limited to, $LiMn_{1.5}Ni_{0.5}O_4$, $LiMn_{1.5}Al_{0.5}O_4$, $LiMn_{1.5}Mg_{0.5}O_4$, $LiMn_{1.5}Co_{0.5}O_4$, $LiMn_{1.5}Fe_{0.5}O_4$, and $LiMn_{1.5}Zn_{0.5}O_4$. As the lithium titanate, examples include, but are not limited to, $Li_4Ti_5O_{12}$. As the lithium metal phosphate, examples include, but are not limited to, $LiFePO_4$, $LiMnPO_4$, $LiCoPO_4$ and $LiNiPO_4$. As the transition metal oxide, examples include, but are not limited to, $V_2O_5$ and $MoO_3$. As the lithium storage intermetallic compound, examples include, but are not limited to, $Mg_2Sn$, $Mg_2Ge$, $Mg_2Sb$ and $Cu_3Sb$.

As the lithium alloy, examples include, but are not limited to, Li—Au, Li—Mg, Li—Sn, Li—Si, Li—Al, Li—B, Li—C, Li—Ca, Li—Ga, Li—Ge, Li—As, Li—Se, Li—Ru, Li—Rh, Li—Pd, Li—Ag, Li—Cd, Li—In, Li—Sb, Li—Ir, Li—Pt, Li—Hg, Li—Pb, Li—Bi, Li—Zn, Li—Tl, Li—Te and Li—At. As the Si alloy, examples include, but are not limited to, an alloy of Si and a metal such as Li, and an alloy of Si and at least one kind of metal selected from the group consisting of Sn, Ge and Al.

The form of the cathode active material is not particularly limited. It may be a particulate form. When the cathode active material is in a particulate form, the cathode active material may be primary particles or secondary particles. The average particle diameter (D50) of the cathode active material may be 1 nm or more and 100 μm or less, or it may be 10 nm or more and 30 μm or less, for example.

On the surface of the cathode active material, a coating layer containing a ion conductive oxide may be formed. This is because a reaction between the cathode active material and the solid electrolyte can be suppressed.

As the Li ion conductive oxide, examples include, but are not limited to, $LiNbO_3$, $Li_4Ti_5O_{12}$, and $Li_3PO_4$. The thickness of the coating layer is, for example, 0.1 nm or more, and it may be 1 nm or more. On the other hand, the thickness of the coating layer is, for example, 100 nm or less, and it may be 20 nm or less. The coating rate of the coating layer on the surface of the cathode active material is, for example, 70% or more, and it may be 90% or more.

As the solid electrolyte, examples include, but are not limited to, those exemplified below in [Solid electrolyte layer].

The amount of the solid electrolyte contained in the cathode layer is not particularly limited. It may be within a range of, for example, from 1 mass % to 80 mass % of the total mass (100 mass %) of the cathode layer.

As the conductive material, a known material can be used, such as a carbon material and metal particles. As the carbon material, examples include, but are not limited to, at least one selected from the group consisting of acetylene black, furnace black, VGCF, carbon nanotube and carbon nanofiber. Among them, at least one selected from the group consisting of VGCF, carbon nanotube and carbon nanofiber may be used, from the viewpoint of electron conductivity. As the metal particles, examples include, but are not limited to, particles of Ni, Cu, Fe and SUS.

The amount of the conductive material contained in the cathode layer is not particularly limited.

As the binder, examples include, but are not limited to, acrylonitrile butadiene rubber (ABR), butadiene rubber (BR), polyvinylidene fluoride (PVdF) and styrene butadiene rubber (SBR). The amount of the binder contained in the cathode layer is not particularly limited.

The thickness of the cathode layer is not particularly limited.

The cathode layer can be formed by a conventionally known method.

For example, the cathode active material and, as needed, other components are put in a solvent; they are stirred to prepare a slurry for a cathode layer; and the slurry for the cathode layer is applied on one surface of a support such as a cathode current collector; and the applied slurry is dried, thereby obtaining the cathode layer.

As the solvent, examples include, but are not limited to, butyl acetate, butyl butyrate, heptane, and N-methyl-2-pyrrolidone (NMP).

The method for applying the slurry for the cathode layer on one surface of the support such as the cathode current collector, is not particularly limited. As the method, examples include, but are not limited to, the doctor blades method, the metal mask printing method, the static coating method, the dip coating method, the spread coating method, the roll coating method, the gravure coating method, and the screen printing method.

As the support, one having self-supporting property can be appropriately selected and used without particular limitation. For example, a metal foil such as Cu and Al can be used.

As another method for forming the cathode layer, the cathode layer may be formed by pressure molding a cathode mixture powder containing the cathode active material and, as needed, other components. In the case of pressure molding the cathode mixture powder, generally, a press pressure of about 1 MPa or more and 600 MPa or less is applied.

The method for applying the pressure is not particularly limited. As the method, examples include, but are not limited to, a pressure applying method using a plate press machine, a roll press machine, or the like.

[Cathode Current Collector]

As the cathode current collector, a known metal that can be used as the current collector of a battery, can be used. As the metal, examples include, but are not limited to, a metal material containing one or more elements selected from the group consisting of Cu, Ni, Al, V, Au, Pt, Mg, Fe, Ti, Co, Cr, Zn, Ge and In. As the cathode current collector, examples include, but are not limited to, SUS, aluminum, nickel, iron, titanium and carbon.

The form of the cathode current collector is not particularly limited. As the form, examples include, but are not limited to, various kinds of forms such as a foil form and a mesh form. The thickness of the cathode current collector varies depending on the shape. For example, it may be in a range of from 1 μm to 50 μm or it may be in a range of from 5 μm to 20 μm.

The cathode current collector may be connected to the cathode terminal. The cathode current collector may be the cathode terminal.

[Anode]

The anode includes an anode layer. As needed, it includes an anode current collector. An anode terminal may be connected to the anode. The anode current collector may be the anode terminal.

The anode includes the facing part and the non-facing wait. The facing part is a region facing the cathode (i.e., the cathode facing part), and the non-facing part is a region non-facing the cathode (i.e., the non-cathode facing part). Accordingly, when the battery is viewed in plan view, the area of the anode is larger than that of the cathode.

The ratio ΔC of the area of the facing part to the area of the non-facing part (i.e., the area of the facing part/the area of the non-facing part) is not particularly limited.

[Anode Layer]

The anode layer contains at least an anode active material. As needed, it contains an electroconductive material, a binder, a solid electrolyte, etc.

As the anode active material, examples include, but are not limited to, lithium metal (Li) and lithium alloy. As long as the anode layer contains, as the anode active material, lithium metal or lithium alloy as a main component, the anode layer may contain a different conventionally-known anode active material. In the disclosed embodiments, the main component means a component that accounts for 50 mass % or more of the total mass (100 mass %) of the anode layer of a fully-charged, solid-state battery. As the conventionally-known anode active material, examples include, but are not limited to, graphite, mesocarbon microbeads (MCMB), highly oriented pyrolytic graphite (HOPG), hard carbon, soft carbon, elemental Si, a Si alloy and $Li_4Ti_5O_{12}$ (LTO). As the lithium alloy and the Si alloy, those exemplified above as the cathode active material may be used.

The form of the anode active material is not particularly limited. As the form, examples include, but are not limited to, a particulate form and a plate form. When the anode active material is in a particulate form, the anode active material may be primary particles or secondary particles. The average particle diameter (D50) of the anode active material may be 1 nm or more and 100 μm or less, or it may be 10 nm or more and 30 μm or less, for example.

As the electroconductive material and binder used in the anode layer, those exemplified above as the electroconductive material and binder used in the cathode layer, may be used. As the solid electrolyte used in the anode layer, those exemplified below as the solid electrolyte used in the solid electrolyte layer, may be used.

The thickness of the anode layer is not particularly limited. For example, it may be from 10 μm to 100 μm.

The amount of the anode active material contained in the anode layer is not particularly limited. It may be from 20 mass % to 90 mass %, for example.

[Anode Current Collector]

The material for the anode current collector may be a material that is not alloyed with Li, such as SUS, Cu and Ni. As the form of the anode current collector, examples include, but are not limited to, a foil form and a plate form. The plan-view shape of the anode current collector is not particularly limited, and examples thereof include, but are not limited to, a circular shape, an ellipse shape, a rectangular shape and any arbitrary polygonal shape. The thickness of the anode current collector varies depending on the shape. For example, it may be in a range of from 1 μm to 50 μm, or it may be in a range of from 5 μm to 20 μm.

The anode current collector may be connected to the anode terminal. The anode current collector may be the anode terminal.

[Solid Electrolyte Layer]

The solid electrolyte layer contains at least a solid electrolyte.

As the solid electrolyte contained in the solid electrolyte layer, a conventionally-known solid electrolyte that is applicable to solid-state batteries can be appropriately used, such as an oxide-based solid electrolyte and a sulfide-based solid electrolyte.

As the sulfide-based solid electrolyte, examples include, but are not limited to, $Li_2S$—$P_2S_5$, $Li_2S$—$SiS_2$, LiX—$Li_2S$—$SiS_2$, LiX—$Li_2S$—$P_2S_5$, LiX—$Li_2O$—$Li_2S$—$P_2S_5$, LiX—$Li_2S$—$P_2O_5$, LiX—$Li_3PO_4$—$P_2S_5$ and $Li_3PS_4$. Note that the description "$Li_2S$—$P_2S$" means a material consisting of a raw material composition including $Li_2S$ and $P_2S_5$, and the same applies to other descriptions. Also, "X" of the above-described LiX indicates a halogen element. The raw material composition may contain one or two or more kinds of LiX. When two or more kinds of LiX are contained, the mixing ratio of the two or more kinds of LiX is not particularly limited.

The molar ratio of the elements in the sulfide-based solid electrolyte can be controlled by adjusting the amounts of the elements in the raw material. Also, the molar ratio and composition of the elements in the sulfide-based solid electrolyte can be measured by ICP emission spectrometry, for example.

The sulfide-based solid electrolyte may be a sulfide glass, a crystalline sulfide glass (glass ceramic) or a crystalline material obtained by carrying out a solid-phase reaction treatment on the raw material composition.

The crystal state of the sulfide-based solid electrolyte can be confirmed, for example, by carrying out powder X-ray diffraction measurement using CuKα rays on the sulfide-based solid electrolyte.

The sulfide glass can be obtained by carrying out an amorphous treatment on the raw material composition such as a mixture of $Li_2S$ and $P_2S_5$. As the amorphous treatment, examples include, but are not limited to, mechanical milling.

The glass ceramic can be obtained, for example, by heat-treating a sulfide glass.

The heat treatment temperature may be a temperature higher than the crystallization temperature (Tc) observed by thermal analysis measurement of the sulfide glass, and it is generally 195° C. or more. On the other hand, the upper limit of the heat treatment temperature is not particularly limited.

The crystallization temperature (Tc) of the sulfide glass can be measured by differential thermal analysis (DTA).

The heat treatment time is not particularly limited, as long as the desired crystallinity of the glass ceramic is obtained. For example, it is within a range of from one minute to 24 hours, and it may be within a range of from one minute to 10 hours.

The heat treatment method is not particularly limited. As the heat treatment method, examples include, but are not limited to, a heat treatment method using a firing furnace.

As the oxide-based solid electrolyte, examples include, but are not limited to, a substance having a garnet-type crystal structure including, for example, a Li element, a La element, an A element (A is at least one of Zr, Nb, Ta and Al) and an O element. The oxide-based solid electrolyte may be $Li_{3+x}PO_{4-x}N_x$ ($1 \leq x \leq 3$), for example.

The form of the solid electrolyte may be a particulate form, from the viewpoint of good handleability.

The average particle diameter (D50) of the solid electrolyte particles is not particularly limited. The lower limit of the average particle diameter may be 0.5 μm or more, and the upper limit may be 2 μm or less.

In the disclosed embodiments, the average particle diameter of the particles is the value of a volume-based median diameter (D50) measured by laser diffraction and scattering particle size distribution measurement, unless otherwise noted. In the disclosed embodiments, the median diameter (D50) is a diameter (volume average diameter) such that the cumulative volume of the particles is half (50%) of the total volume when the particles are arranged in order of particle diameter from smallest to largest.

The solid electrolyte may be one kind of solid electrolyte, or it may be 2 or more kinds of solid electrolytes. In the case of using 2 or more kinds of solid electrolytes, they may be mixed together, or they may be formed into layers to obtain a multilayer structure.

The amount of the solid electrolyte in the solid electrolyte layer is not particularly limited. For example, it may be 50 mass % or more; it may be within a range of 60 mass % or more and 100 mass % or less; it may be within a range of 70 mass % or more and 100 mass % or less; or it may be 100 mass %.

A binder may also be contained in the solid electrolyte layer, from the viewpoint of expressing plasticity, etc. As the binder, examples include, but are not limited to, materials exemplified above as the binder used in the cathode layer. However, to facilitate high output, the binder contained in the solid electrolyte layer may be 5 mass % or less, from the viewpoint of preventing excessive aggregation of the solid electrolyte and enabling the formation of the solid electrolyte layer in which the solid electrolyte is uniformly dispersed.

As the method for forming the solid electrolyte layer, examples include, but are not limited to, pressure molding a solid electrolyte material powder containing a solid electrolyte. In the case of pressure molding the solid electrolyte material powder, generally, a press pressure of about 1 MPa or more and 600 MPa or less is applied.

The method for applying the pressure is not particularly limited. As the method, examples include, but are not limited to, the pressure applying method exemplified above in the formation of the cathode layer.

The thickness of the solid electrolyte layer is not particularly limited. In general, it is 0.1 μm or more and 1 mm or less.

As needed, the solid-state lithium secondary battery includes an outer casing for housing the cathode layer, the anode layer, the solid electrolyte layer, etc.

The material for the outer casing is not particularly limited, as long as it is a material stable in electrolyte. As the material, examples include, but are not limited to, a resin such as polypropylene, polyethylene and acrylic resin.

As the form of the solid-state lithium secondary battery, examples include, but are not limited to, a coin form, a laminate form, a cylindrical form and a square form.

The invention claimed is:

1. A battery system comprising a controller and a solid-state lithium secondary battery comprising a cathode, an anode and a solid electrolyte layer disposed between the cathode and the anode, wherein the cathode comprises a cathode layer;

wherein the cathode layer comprises a cathode active material;

wherein the anode comprises a facing part and a non-facing part; the facing part is a region facing the cathode; and the non-facing part is a region non-facing the cathode;

wherein the controller estimates an end part cathode potential Ve2 from a voltage relaxation amount $\Delta V_2$; the end part cathode potential Ve2 is a local potential of an end part of the cathode; and the voltage relaxation amount $\Delta V_2$ is generated by diffusion of, into the non-facing part of the anode, lithium transferred to the facing part of the anode from the cathode of the solid-state lithium secondary battery in a charged state; and wherein the controller controls execution and inexecution of charging of the solid-state lithium secondary battery so that the end part cathode potential Ve2 is equal to or less than a potential Vlimit at which a change in crystal structure of the cathode active material occurs.

2. The battery system according to claim 1, wherein the controller detects a voltage V1 of the solid-state lithium secondary battery and calculates an end part cathode potential Ve1 from the voltage V1, which is a local potential of the end part of the cathode;

wherein the controller determines whether or not the voltage V1 is a voltage at which the end part cathode potential Ve1 is equal to or less than the potential Vlimit;

wherein, when the voltage V1 is determined to be the voltage at which the end part cathode potential Ve1 is equal to or less than the potential Vlimit, the controller sets the voltage at which the end part cathode potential Ve1 is equal to the potential Vlimit, to a first charging inhibition voltage, and the controller executes first charging by which the solid-state lithium secondary battery is charged until the first charging inhibition voltage is reached;

wherein, after the first charging, the controller suspends charging and discharging of the solid-state lithium secondary battery for a certain period of time;

wherein the controller measures the voltage relaxation amount $\Delta V_2$, estimates the end part cathode potential Ve2 from the voltage relaxation amount $\Delta V_2$, and corrects the end part cathode potential Ve1 to the end part cathode potential Ve2;

wherein the controller detects a voltage $V_2$ of the solid-state lithium secondary battery and determines whether or not the voltage $V_2$ is a voltage at which the end part cathode potential Ve2 is equal to or less than the potential Vlimit; and wherein, when the voltage $V_2$ is determined to be the voltage at which the end part cathode potential Ve2 is equal to or less than the potential Vlimit, the controller sets the voltage at which the end part cathode potential Ve2 is equal to the potential Vlimit, to a second charging inhibition voltage, and the controller executes second charging by which the solid-state lithium secondary battery is charged until the second charging inhibition voltage is reached.

3. The battery system according to claim 2,
wherein the controller discharges the solid-state lithium secondary battery after the second charging;
wherein the controller detects a voltage V3 of the solid-state lithium secondary battery;
wherein the controller determines whether or not the voltage V3 is a voltage at which the end part cathode potential Ve2 is less than the potential Vlimit; and
wherein, when the voltage V3 is determined to be the voltage at which the end part cathode potential Ve2 is less than the potential Vlimit, the controller resets settings of the first and second charging inhibition voltages.

* * * * *